United States Patent [19]

King

[11] 4,457,020

[45] Jun. 26, 1984

[54] SIGNAL PROCESSING DEVICE FOR USE ON RADIO LINKS

[75] Inventor: James R. King, Cedar Rapids, Iowa

[73] Assignee: Rockwell International Corporation, El Segundo, Calif.

[21] Appl. No.: 453,365

[22] Filed: Dec. 27, 1982

[51] Int. Cl.³ .............................................. H04B 1/64
[52] U.S. Cl. .................................... 455/70; 381/104; 455/42
[58] Field of Search ...................... 455/42, 45, 68, 70, 455/72; 333/14; 381/104, 106; 179/170.8

[56] References Cited

U.S. PATENT DOCUMENTS 3,458,815 7/1969 Becker .................................. 333/14
3,885,111 5/1975 Ishigami et al. ....................... 333/14
4,225,967 9/1980 Miwa et al. ............................ 455/68

OTHER PUBLICATIONS

CCIR Recommendations 455-1 dated 1970 through 1974, entitled "Improved Transmission System for HF Radiotelephone Circuits", pp. 82-93.

Primary Examiner—Jin F. Ng
Attorney, Agent, or Firm—Richard K. Robinson; George A. Montanye; H. Fredrick Hamann

[57] ABSTRACT

A signal processor processes communication signals for a communication link by extracting amplitude information from the signal and converting this amplitude information into two signal tones. The frequency information of the communication system is transmitted as a constant amplitude signal with two narrowband FM control channels. Each control channel is used to transmit one of the two tones. After the communication signal is received, the two tones are removed from the narrowband FM control channels and are used to generate control signals that will control a variable gain amplifier and transfer the amplitude information back to the constant amplitude signal thereby facilitating the reception of the communication system.

12 Claims, 4 Drawing Figures

SIGNAL PROCESSING DEVICE FOR USE ON RADIO LINKS

BACKGROUND OF THE INVENTION

This invention relates to a signal processing system for processing a signal that is to be transmitted and received across a data link and then deprocessing the signal upon receipt and, in particular, to a signal processing signal that transmits the frequency information of the communications signal as a constant amplitude signal and the amplitude information as a separate frequency signal.

There is a need to provide improved signal quality for communications over radio links, in particular, at high frequencies (HF), frequencies approximately 30 MHz and below. The CCIR recommendation 455-1 dated 1970 through 1974 and entitled "Improved Transmission Systems for HF Radio Telephone Circuits", questions 13½, describes a method and technical standard commonly referred to as "Lincompex". The Lincompex system has been in use on "long haul" point-to-point HF circuits and, in particular, those circuits which would usually tie-in to common carrier systems. The Lincompex system provides a significant improvement in signal quality over a typical HF radio link when compared to signal quality without the Lincompex signal processing. However, there are two major disadvantages with the Lincompex systems. The absolute frequency accuracy requirement is very stringent with the Lincompex system and requires that the radio equipment employ automatic frequency control (AFC) for HF single sideband links. Very accurate frequency standards must be employed on point-to-point links which do not experience doppler frequency shift effects. Either of the above two methods is a relatively expensive radio equipment feature. Secondly, selective fading which is a result of radio frequency wave propagation, is very common on the HF frequency range. This phenomena causes relatively narrow (less than several hundred hertz) bandwidth signal degradation. This type of degradation does not normally destroy intelligibility of the voice signal, but can seriously degrade a Lincompex voice signal due to loss of the narrowband FM control channel.

SUMMARY OF THE INVENTION

A signal processor processes communication signals for a communication link by extracting amplitude information from the signal and converting this amplitude information into two signal tones. The frequency information of the communication system is transmitted as a constant amplitude signal with two narrowband FM control channels. Each control channel is used to transmit one of the two tones. After the communication signal is received, the two tones are removed from the narrowband FM control channels and are used to generate control signals that will control a variable gain amplifier and transfer the amplitude information back to the constant amplitude signal thereby facilitating the reception of the communication system.

It is the object of this invention to provide a signal processing system that uses two control signal sufficiently separated in frequency within the passband of the communication signal to reduce the susceptibility to selective fades.

It is another object of the invention to provide a signal processor that uses the relative frequency relationship between the two control tones to verify the absolute control tone frequencies.

It is yet another object of the invention to provide a signal processor which will permit the calculation of system frequency offset errors and application of a correction factor at the receive station.

BRIEF DESCRIPTION OF THE DRAWINGS

In order that the invention may be readily carried into practice, a number of embodiments will now be described in detail by way of example, with reference to the accompanying drawings in which.

DETAILED DESCRIPTION OF THE PREFERRED EMBODIMENT

Figure 1:
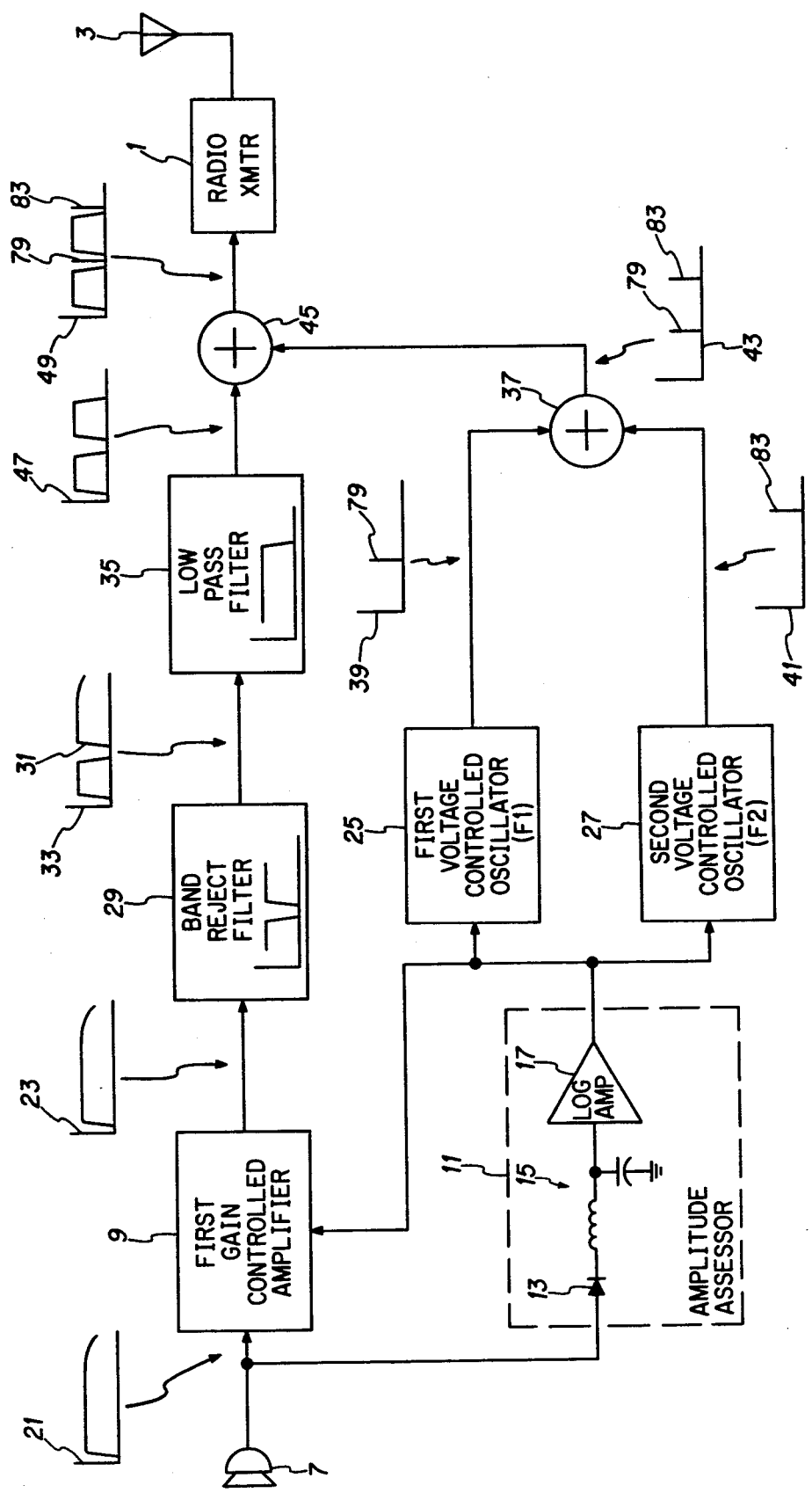
FIG. 1 is a simplified block diagram of a radio transmitter incorporating a signal processor according to the invention.

FIG. 1, to which reference should now be made, illustrates a transmitter portion of a communications system that includes a radio transmitter 1 for transmitting data via an antenna 3. The communication signal that is transmitted by the antenna 3 is provided by a transmit signal processor 5 which obtains, in the preferred embodiment, an audio signal from an input transducer such as a microphone 7 and applies the signal to a first gain control amplifier 9 and an amplitude assessor 11. The audio signal that is applied to the amplitude assessor 11 as well as the first gain control amplifier 9 may be represented by the specturm waveform 21. The amplitude assessor develops a control signal which is logarithmetically proportional to the amplitude of the audio input signal provided by the transducer 7 and includes a diode 13, an LC filter circuit 15 and a logarithmic amplifier 17. The control signal that is provided by the amplitude assessor 11 is applied to the first gain control amplifier 9 to vary the gain such that the output of the first gain control amplifier 9 is essentially a constant level signal which in the preferred embodiment is of the audio range and is represented in FIG. 1 by the spectrum waveform 23. The output of the amplitude assessor 11 is also applied to a first voltage-controlled oscillator 25 and a second voltage-controlled oscillator 27. The control signal varies the frequencies of the first voltage-controlled oscillator 25 and the second voltage-controlled oscillator 27 in proportion to the logarithm of the input signal amplitude. In the preferred embodiment, the output frequency (F1) of the first voltage-controlled oscillator 25 decreases with increasing amplitude of the communication signal that is provided by the input transducer 7. Also, in the preferred embodiment, F1 is equal of 1500 Hz and F2, the output frequency of the voltage-controlled oscillator 27, is approximately equal to 2850 Hz when there is zero amplitude information contained in the input signal. F2 in the preferred embodiment increases with increasing amplitude of the input signal. Thus, the difference between the output frequency F1 of the first voltage-controlled oscillator 25 and the output frequency F2 of the second voltage-controlled oscillator 27 increases with increasing input signal amplitude and of course decreases with decreasing signal amplitude to obtain in the preferred embodiment, a minimal difference of 1350 Hz.

The compressed audio signal is passed through a first band reject filter 29 to provide a first FM control channel that is represented by notch 31 of a spectrum diagram 33. The compressed audio signal is also passed through a lowpass filter 35 which removes the energy at or above the minimum frequency of F2. F1 which is represented by the spectrum waveform 39 and F2 which is represented by the spectrum waveform 41 is combined by a combiner 37, the spectrum of which is represented by waveform 43. The output of the lowpass filter 35 as represented by the spectrum waveform 47 is applied to a combining circuit 45 for combining with the output of the combiner 37. The overall combination is a composite communication system which in the preferred embodiment is an audio signal that is represented by the spectrum diagram 49 and is applied to the radio transmitter 1 for transmission via the antenna 3.

Figure 2:
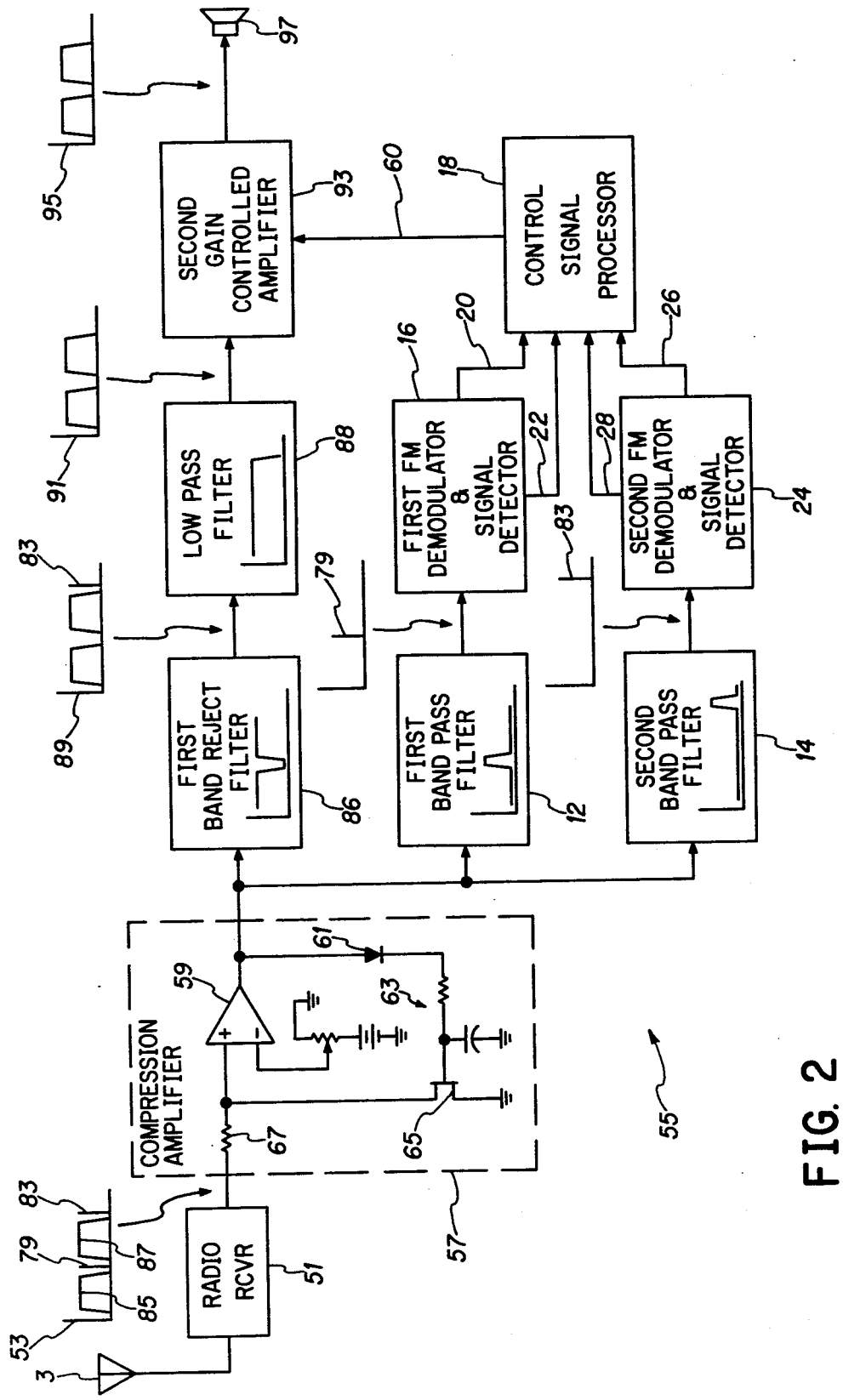
FIG. 2 is a simplified block diagram of a radio receiver having incorporated therein the signal processor according to the invention.

In FIG. 2, to which reference should now be made, an antenna 3 receives a radio signal and applies it to a radio receiver 51 which demodulates the received signal into a composite signal that is represented by the spectrum waveform 53 and applies it to a receive signal processor 55 which recovers the original signal from the composite signal including restoration of the original amplitude information. The received composite signal is passed through a compression amplifier 57 (which is in the preferred embodiment an AGC audio amplifier and includes an amplifier 59, a feedback loop that includes a diode 61 and RC filter 63 which develops a biased signal to a field effect transistor 65 which controls the level of the signal that is applied to the amplifier 59, a constant gain amplifier,) from the radio receiver 51 via the input resistor 67. The compression amplifier removes any amplitude variations which may have been introduced by the communication link over which the received composite signal traveled. The composite signal is separated into the control tones 79 and 83 of waveform 53 and frequency components represented by peaks 85 and 87 of waveform 53 by filtering. A first band reject filter 86 and a second lowpass filter 88 remove the control tones 79 and 83 from the composite signals. This is represented graphically by waveforms 89 and 91. The stripped composite signal is then passed through a second gain control amplifier 93 which restores the original signal amplitude to the composite signal to obtain a signal that is represented by the spectrum 95 and in the preferred embodiment is an audio signal which is applied to a speaker 97.

The second gain control amplifier 93 is controlled by a control signal derived from the control tones 79 and 83. A first bandpass filter 12 separates the first tone 79 from the composite signal and a second bandpass filter 14 separates the second tone 83 from the composite signal. The first tone is demodulated by a first FM demodulator and signal detector 16 and applies the demodulated signal to the control signal processor 18 via conductor 20 and if the first tone 79 is present the FM demodulator and signal detector 16 also provide a logic signal level via conductor 22 to the control signal processor 18 indicating that the first control tone 79 is present. Similarly, the second bandpass filter 14 separates the second control tone 83 from the composite signal that is represented in waveform 53 and applies the separated tones to a second FM demodulator and signal detector 24 which applies the demodulated second control tone 83 to the control signal processor 18 via conductor 26 and a logic indication that the second control tone 83 is present and is also applied to the control signal processor 18 via conductor 28. The signal presence indication from the first and second FM discriminator and signal detector 16 and 24 indicates whether either or both the first control tone or the second control tone is being received. This present output is used by the control signal processor 18 to determine whether the amplifier gain is controlled by the first control tone 79 or the second control tone 83 or both tones. When both the first control tone 79 and the second control tone 83 are present, the control signal processor 18 utilizes the difference between the two FM demodulated outputs as a source of controlling the second gain control amplifier 93. The control signal processor 18 also determines absolute control tone frequency offset caused by a communication link when both the first control tone have 79 and the second control tone 83 are present so that this information can be applied as a correction voltage when only one tone is used for control of the second gain control amplifier 93 as would happen during selective fading over a high frequency RF communication line.

Figure 3:
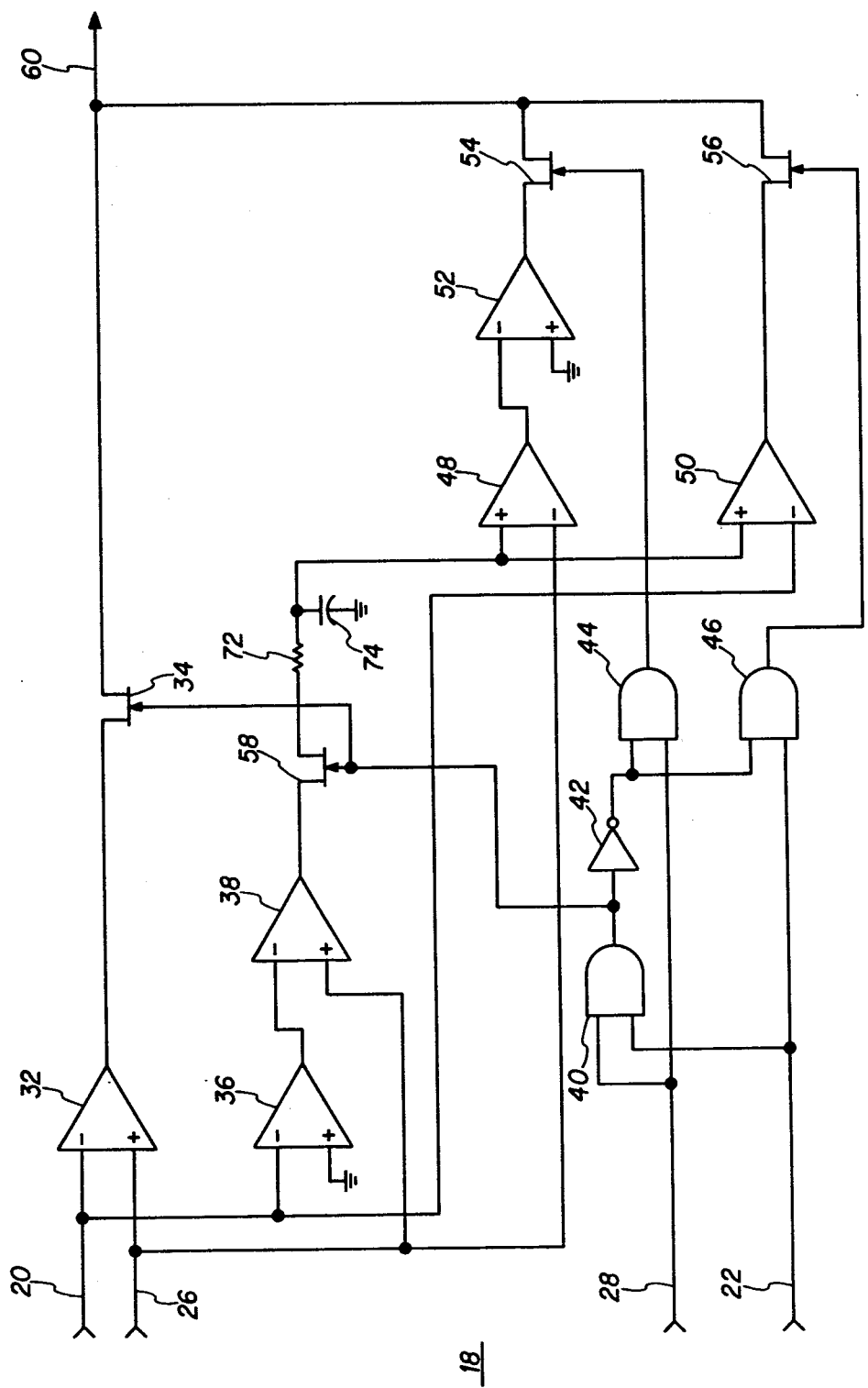
FIG. 3 is a simplified schematic diagram of the control signal processor of FIG. 2.

A simplified schematic diagram of the control signal processor 18 is provided in FIG. 3 to which reference should now be made. The demodulated first signal tone 79 and the demodulated second signal tone 83 are applied to a difference amplifier 32 for application to the second gain control amplifier 93 via conductor 60. The control of the output of the difference amplifier 32 is controlled by an FET switch 34, the gate of which is enabled whenever both the first control tone 79 and the second control tone 83 are present and detected by the first FM demodulator and signal detector 16 of FIG. 2 and the second FM demodulator and signal detector 24 also of FIG. 2. The logic indication of both of these signal present is applied to a AND gate 40 and if both signals are present then the FET switch 34 is activated allowing the difference between the demodulated first control signal 79 and the second demodulated control signal 83 to be applied to the second gain control amplifier 93. Additionally, the output of the AND 40 also causes switch 58 to conduct which causes capacitor 74 to integrate the output of the difference amplifier 38 which provides an absolute control tone frequency offset. The output of amplifier 38 is applied to the capacitor 74 via the FET switch 58 and resistors 72. Inverting amplifier 36 inverts the first demodulated control tone and applies it to amplifier 38 and, in particular, to the inverting terminal where it is compared with the second demodulated control tone which is applied to the noninverting terminal of the amplifier 38. The output of the amplifier 38 provides the absolute control frequency which can be used as a correction voltage when only one tone is present for control of the second gain control amplifier 93.

In the event that only one tone should happen to be present such as the second control tone 83, then conductor 28 will have an indication that this tone is present and apply this information to the AND gate 44. The output of the AND gate 40 is a logic zero since there is no indication of the first control tone being present on conductor 22. The inverter 42 provides a logic one indication to the AND gate 44 and this logic one indication is used to activate the FET switch 54 which will allow the second control tone that is present on conductor 26 to be used as the means of controlling the second gain control amplifier 93 after being corrected for the absolute control tone frequency offset by the comparison made by the difference amplifier 48 between the voltage that is stored on capacitor 74 and the demodulated second control tone 83. The results of this comparison is inverted by inverting amplifier 52 and applied to the second gain control amplifier 93 via conductor 60 and FET switch 54.

In the event that only the first control tone is present, then the AND gate 46 will provide a logic one to the FET switch 56 which will conduct the output of the difference amplifier 50 which contains the difference between the first demodulated control tone and the voltage that is stored on capacitor 62 to the gain control amplifier 93 via FET switch 56 and conductor 60. It should be pointed out that through the operation of the AND gates 40, 44 and 46, only FET switch 34 conducts when both the first control tone 79 and the second control tone 83 are present, only FET switch 54 conducts when the second control tone 83 is present and only FET switch 56 conducts when the first control tone 79 is present.

Figure 4:
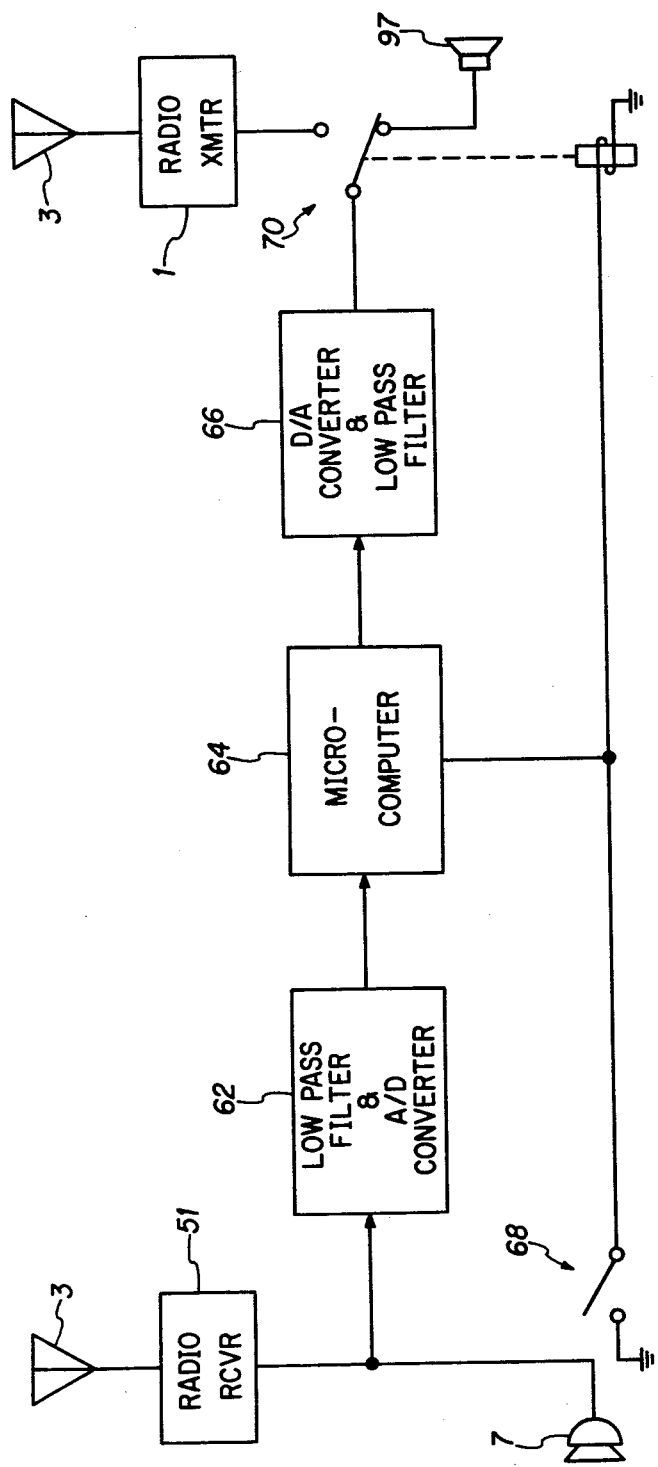
FIG. 4 is a digital implementation of the signal processor according to the invention.

FIG. 4 is an embodiment of the single processor according to the invention which incorporates microprocessor technology to implement the signal processing according to the invention. A lowpass filter and A/D converter 62 converts the audio information that is provided either from the microphone 7 or the radio receiver 51 and antenna 3 into digital information for application to a microcomputer 64. If a push-to-talk key 68 is pressed indicating that the signal originates from the input transducer 7, then the microcomputer 64 performs through algorithms contained therein the functions performed by the transmit signal processor 5 of FIG. 1 and applies this information to a D/A converter and lowpass filter 66 for application to the radio transmitter 1 and antenna 3 via the push-to-talk key switch 70. If the switch 68 is not closed, then the radio receiver 51 provides the audio signal to the lowpass filter and A/D converter 62 where the composite signal is converted into a digital signal and applied to a microcomputer 64. Under these conditions the microcomputer 64 implements the functions performed by the received signal processor 55 of FIG. 2 and applies this information to the D/A converter and lowpass filter 66 for application to the output transducer or speaker 97 via the push-to-talk key switch 70.

Many changes and modifications in the above described invention can, of course, be carried out without departing from the scope thereof. Accordingly, the invention is intended to be limited only by the scope of the appended claims.

I claim:

1. A signal processor for processing a communication signal for a communication link comprising:
    a transmit processing means for extracting amplitude information from the communication signal to obtain a constant amplitude signal and a first signal tone, and a second signal tone with the frequency of each signal tone representing the amplitude of the communication signal;
    combining means for combining the first signal and the second signal with the constant amplitude signal to obtain a transmit signal;
    receive processor means for separating the first signal tone, the second signal tone, and the constant amplitude signal from the transmit signal; and
    control processor means for converting the constant amplitude signal into the communication signal in response to the separated first or second signal tone.

2. The signal processor according to claim 1 wherein the transmit processing means comprises:
    amplitude converter means for converting the amplitude information into the first signal tone having a frequency of a first selected band of frequencies and the second signal tone having a frequency of a second selected band of frequencies;
    dual filter means for dividing the communication signal into passing a third band of frequencies that are less than the first band of frequencies and a fourth band of frequencies that fall between the first and second band of frequencies; and
    combiner means for combining the first and second signal tone with the third and fourth band of frequencies.

3. The signal processor according to claim 2 wherein the amplitude converter means comprises:
    amplitude assessor means for generating a first control signal that is logorithmetically proportional to the amplitude of the communication signal;
    first oscillator means for providing the first signal tone in response to the first control signal; and
    second oscillator means for providing the second signal tone in response to the first control signal.

4. The signal processor according to claim 2 wherein the dual filter means comprises:
    a band reject filter means for filtering the first band frequencies out of the communication signal to obtain a notched signal; and
    a lowpass filter means for passing the frequencies of the notched signal that are less than the second selected band of frequencies to obtain a dual matched signal.

5. The signal processor according to claim 2 wherein the receive processor means comprises:
    a first band reject filter for removing the first signal tone from the transmit signal to obtain a first filtered signal;
    a first lowpass filter means for removing said second signal tone from said first filtered signal to obtain the third and fourth band of frequencies;
    a second bandpass filter means for passing only the first band of frequencies of the transmit signal to obtain the first signal tone thereby; and
    a third bandpass filter means for passing only the second band of frequencies of the transmit signal to obtain the second signal tone thereby.

6. The signal processor according to claim 5 wherein the control processor means comprises:
    a first FM demodulator means for demodulating the first signal tone to obtain a first control signal;
    a second FM demodulator means for demodulating the second signal tone to obtain a second control signal; and
    gain controlled amplifier means responsive to either the first control signal or the second control signal for controlling the amplitude of the third and fourth band of frequencies.

7. A method for processing a communication signal for a communication link comprising:
    extracting amplitude information from the communication signal to obtain a constant amplitude signal and a first signal tone, and a second signal tone with the frequency of each signal tone representing the amplitude of the communication signal;

combining the first signal and the second signal with the constant amplitude signal to obtain a transmit signal;

transmitting the transmit signal;

receiving the transmit signal;

separating the first signal tone, the second signal tone, and the constant amplitude signal from the transmit signal; and converting the constant amplitude signal into the communication signal in response to the separated first or second signal tone.

8. The method according to claim 7 wherein the step of extracting amplitude information comprises:

converting the amplitude information into the first signal tone having a frequency of a first selected band of frequencies and the second signal tone having a frequency of a second selected band of frequencies;

dividing the communication signal into a third band of frequencies that are less than the first band of frequencies and a fourth band of frequencies that fall between the first and second band of frequencies; and combining the first and second signal tone with the third and fourth band of frequencies.

9. The method according to claim 8 wherein the step of converting the amplitude information comprises:

generating a first control signal that is logarithmetically proportional to the amplitude of the communication signal;

generating the first signal tone in response to the first control signal; and generating the second signal tone in response to the first control signal.

10. The method according to claim 8 wherein the step of dividing the communication signal comprises:

filtering the first band frequencies out of the communication signal to obtain a notched signal; and passing the frequencies of the notched signal that are less than the second selected band of frequencies to obtain a dual matched signal.

11. The method according to claim 8 wherein the step of separating the first signal tone, the second signal tone, and the constant amplitude signal comprises:

removing the first signal tone from the transmit signal to obtain a first filtered signal;

removing the second signal tone from the first filtered signal to obtain the third and fourth band of frequencies;

filtering only the first band of frequencies of the transmit signal to obtain the first signal tone thereby; and filtering only the second band of frequencies of the transmit signal to obtain the second signal tone thereby.

12. The method according to claim 11 wherein the step of converting the amplitude of the constant amplitude signal comprises:

demodulating the first signal tone to obtain a first control signal;

demodulating the second signal tone to obtain a second control signal; and controlling the amplitude of the third and fourth band of frequencies in response to the first or second control signal.

* * * * *